US008332342B1

(12) United States Patent
Saha et al.

(10) Patent No.: US 8,332,342 B1
(45) Date of Patent: Dec. 11, 2012

(54) MODEL-BASED PROGNOSTICS FOR BATTERIES WHICH ESTIMATES USEFUL LIFE AND USES A PROBABILITY DENSITY FUNCTION

(75) Inventors: Bhaskar Saha, San Jose, CA (US); Kai F. Goebel, Mountain View, CA (US)

(73) Assignee: The United States of America as Represented by the Administrator of the National Aeronautics & Space Administration (NASA), Washington, DC (US)

( * ) Notice: Subject to any disclaimer, the term of this patent is extended or adjusted under 35 U.S.C. 154(b) by 443 days.

(21) Appl. No.: 12/622,407

(22) Filed: Nov. 19, 2009

(51) Int. Cl.
G06F 17/00 (2006.01)
(52) U.S. Cl. .......................................... 706/45
(58) Field of Classification Search .................. 706/12, 706/45, 62
See application file for complete search history.

(56) References Cited

U.S. PATENT DOCUMENTS

2010/0001870 A1* 1/2010 Hong et al. ................ 340/636.1
2010/0124702 A1* 5/2010 White ........................ 429/217

OTHER PUBLICATIONS

Plett, Extended Kalman Filtering for Battery Management Systems of LiPB-Based HEV Battery Packs Part 1. Background, Journal of Power Sources, Jun. 9, 2004, 252-261, 134.
Plett, Extended Kalman Filtering for Battery Management Systems of LiPB-Based HEV Battery Packs Part 2. Modeling . . . , Journal of Power Sources, May 28, 2004, 252-292, 134.
Plett, Extended Kalman Filtering for Battery Management Systems of LiPB-Based HEV Battery Packs Part 3. State and . . . , Journal of Power Sources, May 28, 2004, 52-292, 134.
Rufus, et al., Health Monitoring Algorithms for Space Application Batteries, in Proceedings of International Conference on Prognostics and Health Management, 2008, PHM 2008.
Santhanagopalan, et al., Parameter Estimation and Life Modeling of Lithium-Ion Cells, Journal of The Electrochemical Society, Mar. 7, 2008, A345-A353, 155-4.
Stamps, et al., "Analysis of Capacity Fade in a Lithium Ion Battery." Journal of Power Sources, Apr. 26, 2005, 229-239, 150, 2005 Elsevier B.V.
Vutetakis, et al., Determining the State-of-Health of Maintenance Free Aircraf . . . , Proceedings of Tenth Annual Battery Conference on Applications and Advances, 1995, 13-18.
Bhangu, et al., Nonlinear Observers for Predicting State-of-Charge and State-of-Health . . . , IEEE Transactions on Vehicular Technology, May 2005, 783-794, 54, 3, 2000 IEEE.
Blanke, et al., Impedance Measurements on Lead-Acid Batteries for State-of-Charge, State-of-Health and cr . . . , Journal of Power Sources, Dec. 30, 2004, 418-425, 144, 2.

(Continued)

*Primary Examiner* — David Vincent
(74) *Attorney, Agent, or Firm* — John F. Schipper; Robert M. Padilla

(57) ABSTRACT

This invention develops a mathematical model to describe battery behavior during individual discharge cycles as well as over its cycle life. The basis for the form of the model has been linked to the internal processes of the battery and validated using experimental data. Effects of temperature and load current have also been incorporated into the model. Subsequently, the model has been used in a Particle Filtering framework to make predictions of remaining useful life for individual discharge cycles as well as for cycle life. The prediction performance was found to be satisfactory as measured by performance metrics customized for prognostics for a sample case. The work presented here provides initial steps towards a comprehensive health management solution for energy storage devices.

38 Claims, 9 Drawing Sheets

OTHER PUBLICATIONS

Cox, et al., Battery State of Health Monitoring, Combining Conductance . . . , Proceedings of 22nd International Telecommunications Energy Conference, INTELEC, 2000, 342-347.

Gao, et al., Dynamic Lithium-Ion Battery Model for System Simulation, IEEE Transactions on Components and Packaging Technologies, Sep. 2002, 495-505, 25, 3, 2002 IEEE.

Goebel, et al., Prognostics in Battery Health Management, IEEE Instrumentation and Measurements Magazine, Aug. 2008, 33-40, 11, 4, 2008 IEEE.

Hartley, et al., A First Principles-Based Battery Model Investi . . . , Proceedings of AIAA 3rd International Energy Conversion Engineering Conference, 2005, San Francisco, CA.

Hartmann II, An Aging Model for Lithium-Ion Cells, PhD dissertation, University of Akron, 2008.

Jaworski, Statistical Parameters Model for Predicting Time to Failure . . . , Proceedings of 21st International Telecommunications Energy Conference, INTELEC, 1999, 1999 IEEE.

Kozlowski, Electrochemical Cell Prognostics Using Online Impedance Measurements and Model-Based . . . , Proceedings of IEEE Aerospace Conference, 2003, 3257-3270, 7, 2003 IEEE.

Meissner, et al., Battery Monitoring and Electrical Energy Management—Precondition for Future Vehicle Electric Power Systems, Journal of Power Sources, 2003, 79-98, 116, 1.

* cited by examiner

MODEL-BASED PROGNOSTICS FOR BATTERIES WHICH ESTIMATES USEFUL LIFE AND USES A PROBABILITY DENSITY FUNCTION

ORIGIN OF THE INVENTION

The invention described herein was made in the performance of work under a NASA contract and by an employee of the United States Government and is subject to the provisions of Public Law 96-517 (35 U.S.C. §202) and may be manufactured and used by or for the Government for governmental purposes without the payment of any royalties thereon or therefore. In accordance with 35 U.S.C. §202, the contractor elected not to retain title.

FIELD OF THE INVENTION

This invention relates to prognostics and estimation of remaining useful life (RUL) of an object in use.

BACKGROUND OF THE INVENTION

Americans purchase nearly 3 billion batteries (dry-cells) every year. On average, each person in the US disposes of 8 batteries every year (PKIDs, 2009). A rechargeable battery can replace hundreds of single-use batteries over its life. Also, all batteries contain metals such as mercury, lead, cadmium, nickel and lithium, which may contaminate the environment if disposed of improperly, hence reducing consumption eases the strain on natural resources.

During Operation Iraqi Freedom, the Marines used an estimated average of 3,028 batteries per day, which was half the requirement of the entire battlefield. Apart from the issue of increasing efficiency, and reducing cost and wastage, rechargeable batteries are a key enabling technology for solving energy problems of the future. One key feature of renewable energy sources, such as solar, wind, tidal, hydropower, etc. is that these sources are not continually available. A report by the California ISO Board notes that, "Wind generation energy production is extremely variable, and in California, it often produces its highest energy output when the demand for power is at a low point" (CA ISO, 2008). An energy storage facility coupled with these power generation sources would make these solutions more economically feasible. Such energy storages, comprising batteries, fuel cell or super-capacitors, would in turn need reliable health monitoring systems to ensure viable levels of system availability, reliability and sustainability and to protect the assets from degradation due to non-optimal usage. Battery health management will also play a critical role in electric vehicles that will be dependant on an accurate gauge for remaining electrical charge and for trade-offs in long-term durability and short-term usage needs.

A primary purpose of modeling battery aging is to enable effective battery health monitoring (BHM) applications that ensure that the battery operation stays within design limits and to provide warning or mitigate damage when these limits are exceeded. Current BHM efforts come in many flavors, from the data-driven (Rufus et al., 2008) to the model-based (Plett, 2004) and even hybrid approaches (Goebel et al., 2008). Implementation complexity can range from intermittent manual measurements of voltage and electrolyte specific gravity to fully automated online supervision of various measured and estimated battery parameters using dynamic models. The sophistication of the models also varies from a collection of basis functions (Stamps et al., 2005) to detailed formulations derived from physical analysis of the cell (Hartley and Jannette, 2005).

Viewing the issue from the applications perspective, researchers in the aerospace domain have examined the various failure modes of the battery subsystems. Different diagnostic methods have been evaluated, like discharge to a fixed cut-off voltage, open circuit voltage, voltage under load and electrochemical impedance spectrometry (EIS) (Vutetakis and Viswanathan, 1995). In the field of telecommunications, workers have sought to combine conductance technology with other measured parameters like battery temperature/differential information and the amount of float charge (Cox and Perez-Kite, 2000).

Other workers have concentrated more on the prognostic approach than on the diagnostic one. Statistical parametric models have been built to predict time to failure (Jaworski, 1999). Electric and hybrid vehicles have been another fertile area for battery health monitoring (Meissner and Richter, 2003). Impedance spectroscopy has been used to build battery models for cranking capability prognosis (Blanke et al., 2005). State estimation techniques, such as the Extended Kalman Filter (EKF), have been applied for real-time prediction of state-of-charge (SOC) and state-of-life (SOL) of automotive batteries (Bhangu et al., 2005; Plett, 2004). A decision-level fusion of data-driven algorithms, such as Autoregressive Integrated Moving Average (ARIMA) and neural networks, has been investigated for both diagnostics and prognostics (Kozlowski, 2003). As the popular cell chemistries changed from lead acid to nickel metal hydride to lithium ion, cell characterization efforts have kept pace. Dynamic models for the lithium ion batteries that take into consideration nonlinear equilibrium potentials, rate and temperature dependencies, thermal effects and transient power response have been built (Gao et al., 2002; Hartmann II, 2008; Santhanagopalan et al., 2008).

However, a need still exists for a flexible prognostics framework that combines the sensor data from battery monitors, the models developed, and the appropriate state estimation and prediction algorithms, in the form of an integrated BHM solution.

Battery Characteristics.

Batteries are essentially energy storage devices that facilitate the conversion, or transduction, of chemical energy into electrical energy, and vice versa (Huggins, 2008). A battery includes a pair of electrodes (anode and cathode) immersed in an electrolyte and sometimes separated by a separator. The chemical driving force across the cell is due to the difference in the chemical potentials of its two electrodes, which is determined by the difference between the standard Gibbs free energies the products of the reaction and of the reactants. The theoretical open circuit voltage, $E^0$, of a battery is measured when all reactants are at 25° C. and at 1M concentration or 1 atm pressure. However, this voltage is not available during use, due to the various passive components inside like the electrolyte, the separator, terminal leads, etc. The voltage drop due to these factors can be mainly categorized as:

IR drop—This drop in cell voltage is due to the current flowing across the internal resistance of the battery.

Activation polarization—This term refers to the various retarding factors inherent to the kinetics of an electrochemical reaction, like the work function that ions must overcome at the junction between the electrodes and the electrolyte.

Concentration polarization—This factor takes into account the resistance faced by the mass transfer (e.g. diffusion)

process by which ions are transported across the electrolyte from one electrode to another.

FIG. 1 illustrates a typical polarization curve of a battery with the contributions of all three of the above factors shown as a function of the current drawn from the cell. Since, these factors are current-dependent, i.e. they come into play only when some current is drawn from the battery, the voltage drop caused by them usually increases with increasing output current.

Because the output current plays such a big role in determining the losses inside a battery, it is an important parameter to consider when comparing battery performance. The term most often used to indicate the rate at which a battery is discharged is the C-Rate (Huggins, 2008). The discharge rate (C-rate) of a battery is expressed as C/r, where r is the number of hours required to completely discharge the nominal capacity of the battery. Thus, a 2 Amp-hour battery discharging at a rate of C/10 or 0.2 Amps would last for 10 hours. The terminal voltage of a battery, and the charge delivered, can vary appreciably with changes in the C-Rate. Further, the amount of energy supplied, related to the area under the discharge curve, is also strongly C-Rate dependent. FIG. 2 illustrates a typical discharge of a battery and its variation with C-Rate. Each curve corresponds to a different C-Rate or C/r value (the lower the r the higher the current) and assumes constant temperature conditions.

Moving on from the theoretical aspects to the application point of view, the relevant physical properties of a battery may be different in different cases. Sometimes specific energy and specific power (energy and power available per unit weight) are important, as in vehicle propulsion applications. Other times the amount of energy stored per unit volume, called the energy density, can be more important for batteries that power portable electronic devices, like cell-phones, laptop computers, cameras, etc., while power per unit volume, known as power density, can be important for some uses like cordless power tools. However, in recent times when the use of rechargeable batteries is proliferating in consumer products, an important parameter to consider is cycle life, which is the number of times a battery can be recharged before its capacity has faded beyond acceptable limits (typically about 20-30 percent).

The degradation of battery capacity with aging, as manifested by the cycle life parameter, can be modeled using Coulombic efficiency $\eta_C$, defined as the fraction of the prior charge capacity that is available during the following discharge cycle (Huggins, 2008). This depends upon a number of factors, especially current and depth of discharge in each cycle. The temperature at which batteries are stored and operated under also has a significant effect on the Coulombic efficiency. FIG. 3 illustrates the degradation of battery capacity with increase of cycles for different values of Coulombic efficiency. Note how even a small inefficiency factor of 0.5 percent (Coulombic efficiency=0.995) can reduce the capacity by about 60 percent within 100 cycles.

SUMMARY OF THE INVENTION

These needs are met by the invention, which provides as many as eight different battery prognostic modes for estimating, or estimating and predicting state of charge (SOC), state of life (SOL), end of discharge (EOD) and/or end of life (EOD) for a battery that is undergoing active use. Estimation of present state of charge (SOC) is referred to herein as mode A; estimation of state of life (SOL) is referred to herein as mode B; rediction of end of discharge (EOD) is referred to herein as mode C; and prediction of end of life (EOL) is referred to herein as mode D. Mode A must precede mode C, and mode B must precede mode D. Ar least eight different combinations of the modes A, B, C and D are possible: A, A+C, B, B+D, A+B, A+C+B, A+B+D, and A+C+B+D. Different analyses are performed for the modes A and C (Eqs. (1)-(5), (7), (8), and optionally (11) and (12) in the following) and for the modes B and D (Eqs. (6), (9), (10) and optionally (11) in the following).

DESCRIPTION OF BEST MODES OF THE INVENTION

Li Ion Batteries Characteristics

Figure 1:
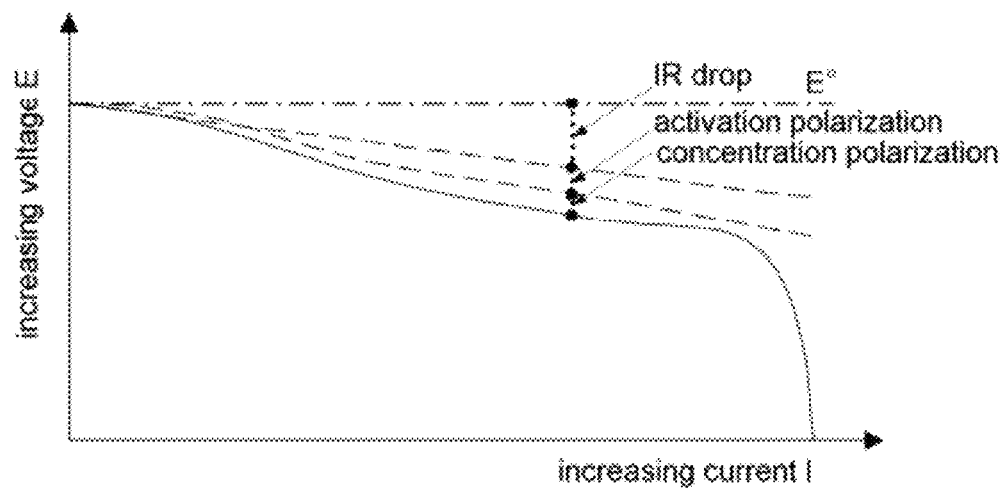
FIG. 1 is a graphical view of voltage versus current for a battery.
Figure 2:
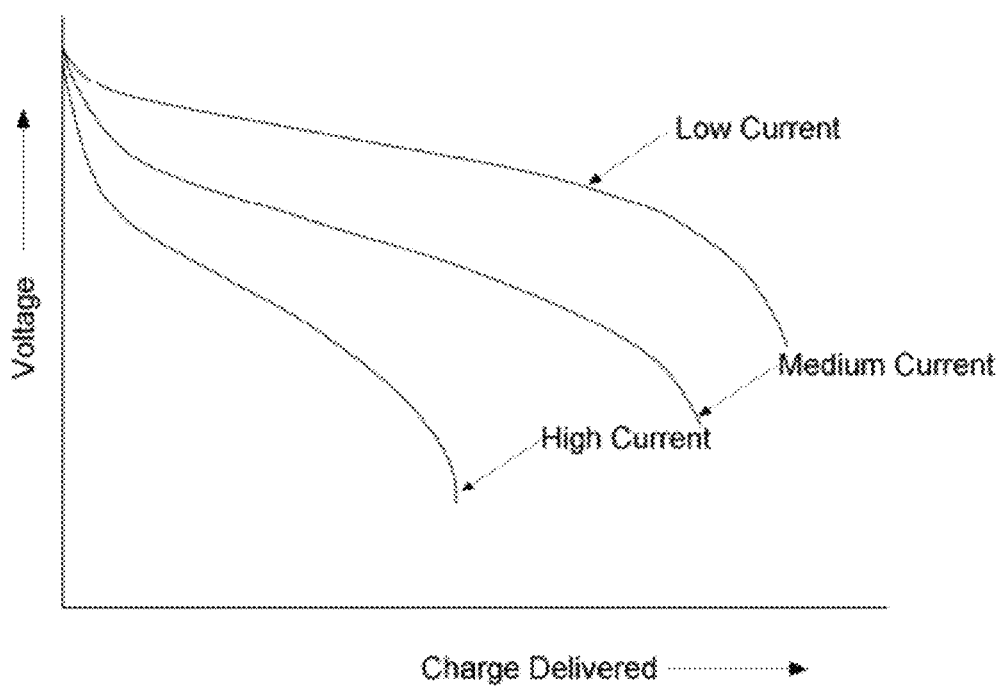
FIG. 2 graphically illustrates influence of current density upon a discharge curve for a battery.
Figure 3:
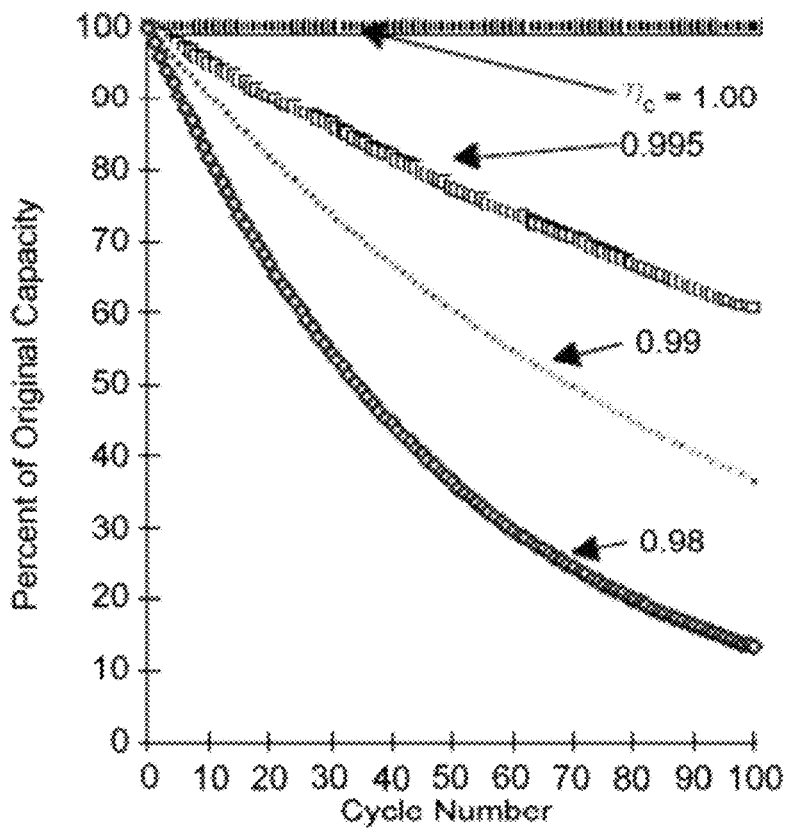
FIG. 3 graphically illustrates influence of Coulombic efficiency on available charge capacity during battery recycling.

Several rechargeable battery technologies are available on the market at present, each having distinct characteristics. However, Li-ion batteries ("LIBs") are becoming increasingly popular for a variety of applications, from consumer electronics to power tools to electric vehicles and even to space applications. Li-ion batteries have a number of important advantages over competing technologies (Huggins, 2008):

- Since the electrodes of a Li-ion battery are made of lightweight lithium and carbon, they are usually lighter than other types of rechargeable batteries of the same size. Lithium is also a highly reactive element; hence a lot of energy can be stored in its atomic bonds. This translates into a very high energy density for Li-ion batteries as compared to other chemistries like lead-acid or NiCd (nickel-cadmium) or NiMH (nickel-metal hydride).
- LIBs have a low self-discharge rate so that they hold their charge for longer periods of time. Self-discharge is caused by the residual ionic and electronic flow through a cell even when there is no external current being drawn.
- LIBs have no memory effect so they do not have to be completely discharged before recharging in order to retain full charge capacity, as with some battery chemistries like NiCd.

LIBs have a long cycle life. They can handle hundreds of charge and discharge cycles without significant degradation of their capacity.

However, LIBs have some disadvantages as well (Buchmann, 2001; Huggins, 2008):

The service life or shelf life of a Li-ion battery decreases with aging even if the battery is not used, unlike other battery chemistries. This means that from the time of manufacturing, regardless of the number of times it was cycled, the capacity of a Li-ion battery will decline gradually. This is due to an increase in internal resistance, which makes the problem more pronounced in high-current applications than low-current ones.

They are more sensitive to high temperatures than most other chemistries. Hot storage and operating conditions causes Li-ion battery packs to degrade much faster than they normally would.

Li-ion batteries can be severely damaged by deep discharge, i.e. by discharging them below the minimum voltage threshold recommended by the manufacturer (usually 2.7 Volts for a single 18650 Li-ion cell). Consequently, Li-ion battery packs come with an on-board circuit to manage the battery. This adds to the expense of a Li-ion battery.

In general Li-ion chemistry is not as safe as NiCd or NiMH chemistry. This is because the anode produces heat during use, while the cathode produces oxygen (not for all Li-ion chemistries). Lithium, being highly reactive, can combine with this oxygen, leading to the possibility of the battery catching on fire.

Considering both the advantages and the drawbacks, Li-ion batteries seem one of the more important battery technology for the present and the foreseeable future. It is for this reason that we chose them for our battery prognostics research.

Modeling Approaches.

Figure 4:
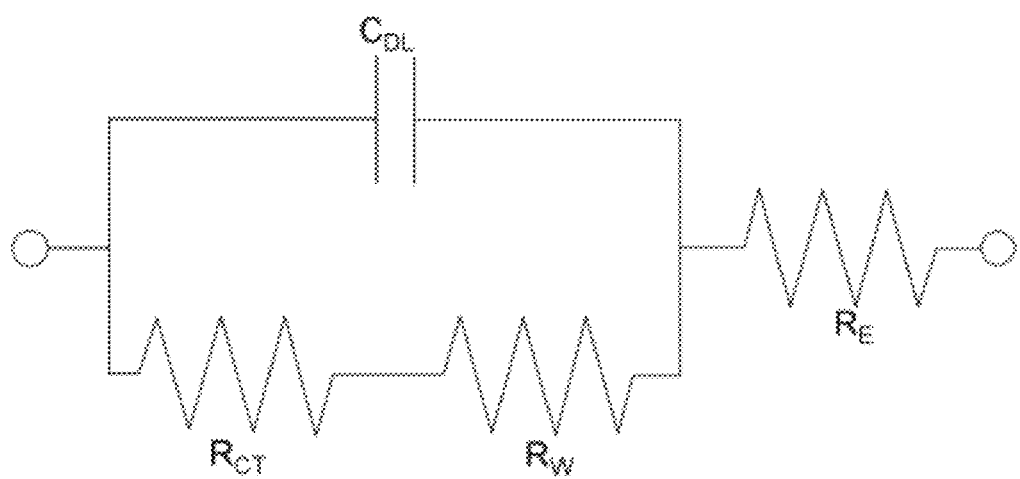
FIG. 4 exhibits a lumped parameter electrical circuit model used for a Li-ion battery.

Modeling a Li-ion battery from first principles of internal electrochemical reactions can be very tedious and computationally intractable. The various losses inside a battery, such as the IR drop, activation polarization and concentration polarization, are represented as impedances in a lumped parameter model in FIG. 4. The IR drop due to electrolyte resistance is denoted as $R_E$. The activation polarization is modeled as a charge transfer resistance $R_{CT}$ and a dual layer capacitance $C_{DL}$ in parallel, while the concentration polarization effect is encapsulated as the Warburg impedance $R_W$.

This lumped parameter model may be analyzed in the time domain to derive the discharge curves of the battery or in the frequency domain to derive the Nyquist plots. The latter can be achieved by EIS measurements, and the plots can subsequently be used to reason about the internal degradation processes. However, EIS measurements require specialized equipment and measurement conditions that prevent them from being widely used in everyday applications.

End-of-Discharge (EOD).

The goal of this research is to predict the RUL for any given discharge cycle of the battery as well as the cycle life. This is a two-part problem with different physical processes affecting the RUL prediction for the end-of-discharge (EOD) and end-of-life (EOL) (Saha and Goebel, 2009). To tackle the EOD problem, we need to predict the way the impedance parameters change with charge depletion during the discharge cycle. Since the impedance parameters are essentially representations of electrochemical reactions and transport processes inside the battery, they are strongly affected by the internal temperature of the battery, the current load and the ionic concentrations of the reactants. We postulate that as discharge progresses the heat generated by the reactions and the current flow causes the internal temperature to go up, effectively increasing the mobility of the ions in the electrolyte, thus decreasing $R_W$. However, decreasing $R_W$ increases the self-discharge rate, effectively increasing the electrolyte resistance $R_E$ of the battery. Also, the increase in temperature results in faster consumption of the cell reactants causing them to be used up rapidly near the end of the discharge resulting in an increase in $R_{CT}$ and a sharp drop in the cell voltage. End of discharge (EOD) is reached when the output voltage hits the minimum safe voltage threshold, $E_{EOD}$, of the cell. For a cell current of I, the output voltage is given by $$E = E^0 - I(R_E + R_{CT} + R_W). \tag{1}$$

Figure 5:
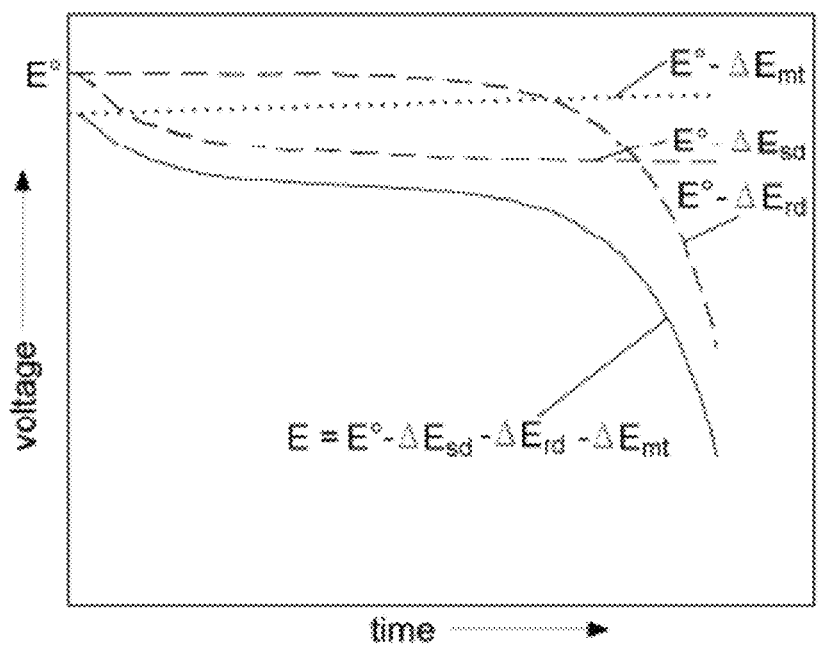
FIG. 5 graphically illustrates decomposition of a Li-ion battery discharge profile into different contributions.

The variations in $E^0$ with internal temperature (Hartmann II, 2008) are not explicitly modeled, but accounted for by the adaptive powers of the PF framework described later. For the empirical charge depletion model considered here, the output voltage is expressed in terms of the effects of the changes in the internal parameters:

$$E(t) = E^0 - \Delta E_{sd}(t) - \Delta E_{rd}(t) - \Delta E_{mt}(t), \tag{2}$$

where t is a time variable during a discharge cycle, $\Delta E_{sd}(t)$ is a voltage drop due to self-discharge, $\Delta E_{rd}$ is the drop due to cell reactant depletion and $\Delta E_{mt}$ denotes the voltage drop due to internal resistance to mass transfer (diffusion of ions). These individual effects are modeled as $$\Delta E_{sd}(t) = \alpha_1 \exp\{-\alpha_2/t\} \tag{3}$$

$$\Delta E_{rd}(t) = \alpha_3 \exp\{\alpha_4 t\}, \tag{4}$$

$$\Delta E_{mt}(t) = \Delta E_{init} - \alpha_5 t, \tag{5}$$

where, $\Delta E_{init}$ is the initial voltage drop when current I flows through the initial value of the internal resistance $R_E$ at the start of the discharge cycle, and $\alpha = \{\alpha_1, \alpha_2, \alpha_3, \alpha_4, \alpha_5\}$ represents a set of model parameters to be estimated from the data. FIG. 5 illustrates how the different voltage drop components defined in eqns. (3)-(5) combine to give the Li-ion discharge profile.

End-of-Life (EOL).

In order to effectively determine the EOL of a Li-ion battery, one needs to understand how the different operational modes, namely charge, discharge and rest, influence the charge capacity, C. The aging model presented in (Hartmann II, 2008) considers only the reduction in capacity with usage while neglecting the effects of rest periods. Use of a smoothing filter on the capacity measurements also reduces the fidelity of the prediction scheme.

Figure 6:
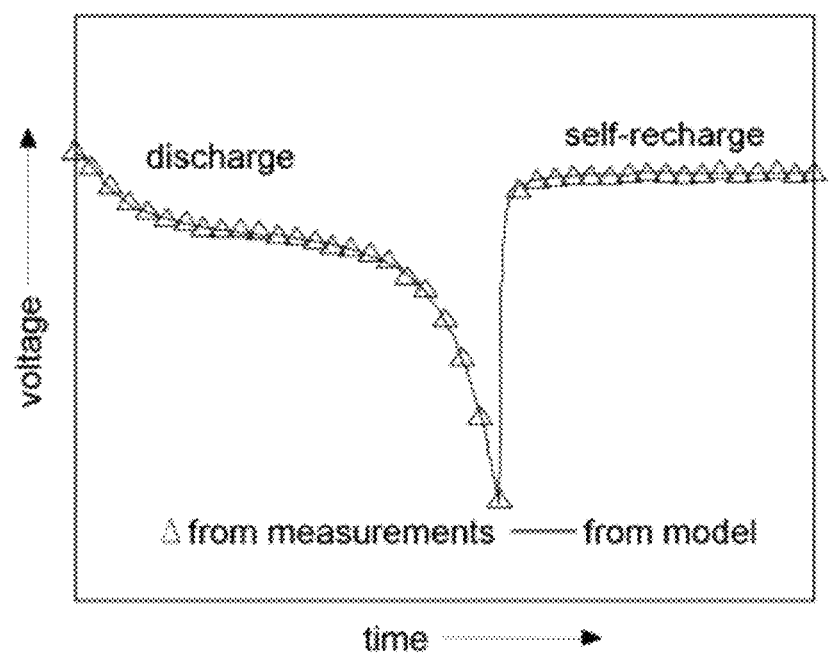
FIG. 6 graphically illustrates discharge and self-recharge for a Li-ion battery.

In the work presented here, the combined effects of charge and discharge cycles is captured by the Coulombic efficiency factor $\eta_C$, as described in Section 4. The remaining factor to be accounted for is the self-recharge during rest. In any battery, reaction products build up around the electrodes and slow the reaction (HowStuffWorks, 2000). By providing rest for the battery, the reaction products have a chance to dissipate, thus increasing the available capacity for the next cycle. For the empirical model used here, this self-recharge is represented as an exponential process, as suggested by data. The equation for battery aging can then be written as $$C_{k+1} = \eta_C C_k + \beta_1 \exp\{-\beta_2/\Delta t_k\}, \tag{6}$$

where $C_k$ denotes the charge capacity of cycle k, $\Delta t_k$ is a rest period length between cycles k and k+1, and $\beta_1$ and $\beta_2$ are model parameters to be determined. FIG. 6 indicates the validity of Eqs. (2)-(6) in modeling the discharge and self-recharge processes for an actual Li-ion battery cycle. Although the model is used to estimate the cell voltage during the self-recharge process in, It is assumed that the SOC of the battery is correlated to the voltage during rest or relaxation periods (Huggins, 2008), when no external current is being drawn, so as to maintain the exponential functional form.
Particle Filtering (PF) Framework.

The formulation of a model is part of, but not the whole, solution. As discussed in the preceding, a number of unknown parameters need to be identified. Even after identification, they may not be directly applicable to the test set since the values may differ from one battery to another, or for the same battery from one cycle to the next. Further, for any given cycle the parameter values may be non-stationary. In general, given a model, the task of tracking a state variable and predicting future values is usually cast as a filtering problem. The variety of filtering techniques published in literature is enormous, with each approach having performance advantages over others depending upon the application. For the task of battery prognostics, including the prediction of EOD and EOL, this method must be reconciled with non-exact non-linear non-stationary models with non-Gaussian noise. Particle Filtering provides us a viable framework that allows us to explicitly represent and manage the uncertainties inherent to our problem.

Particle Filters (Gordon et al., 1993) are a novel class of non-linear filters that combine Bayesian learning techniques with importance sampling to provide good state tracking performance while keeping the computational load tractable. The system state (in this case the battery SOC or voltage or capacity) is represented as a probability density function (pdf) that is approximated by a set of particles (points) representing sampled values from the unknown state space, and a set of associated weights denoting discrete probability masses. The particles are generated from an a priori estimate of the state pdf, propagated through time using a nonlinear process model, and recursively updated from measurements through a measurement model. The main advantage of PFs here is that model parameters can be included as a part of the state vector to be tracked, thus performing model identification in conjunction with state estimation (Saha et al., 2009). After the model has been tuned to reflect the dynamics of the specific system being tracked, it can then be used to propagate the particles till the failure (e.g. EOD or EOL) threshold to give the RUL pdf (Saha et al., 2009).

In the case of our application, the EOD estimation problem is cast in the PF framework as follows. A state transition model and a measurement model are adopted:

$$\alpha_{j,i+1} = \alpha_{j,i} + \omega_{j,i} (j=1,\ldots,5), \quad (7.1)$$

$$E_{i+1} = E_i - \{\alpha_{1,i}\alpha_{2,i}\exp(-\alpha_{2,i}/t_i)/(t_i^2) - \alpha_{3,i}\alpha_{4,i}\exp(\alpha_{4,i}t_i) - \alpha_{5,i}\}/f_s + \omega_i, \quad (7.2)$$

$$\tilde{E}_i = E_i + v_i, \quad (8)$$

where i is a time index, $f_s$ is a sampling frequency, $\tilde{E}_i$ denotes the measured cell voltage at time index i, and $\omega_{j,i}$ (j=1,...,5,), $\omega_i$ and $v_i$ are independent zero-mean Gaussian noise terms.

Equation 7 is used to propagate the particles representing the state vector (comprised of $E_i$ and $\alpha_i$) through each iteration of the particle filter. Equation 8 is used to update the weights of the particles using the terminal voltage measurements. This simultaneously tunes the model parameters, α, along with estimating the state. At the point where prognosis is desired, the tuned model parameters are substituted into Equation 7, which is then computed in an iterative manner until the state value, in this case the terminal voltage $E_i$, reaches a predetermined cut-off threshold.

The EOL estimation problem is similarly recast as a state transition model $$\beta_{j,k+1} = \beta_{j,k} + \phi_{j,k} (j=1,2), \quad (9.1)$$

$$C_{k+1} = \eta_C C_k + \beta_{1,k}\exp\{-\beta_{2,k}/\Delta t_k\} + \phi_k, \quad (9.2)$$

$$\tilde{C}_k = C_k + \psi_k, \quad (10)$$

where k is a cycle index, $\tilde{C}_k$ denotes charge capacity of the battery (component) measured (as an integral of current over discharge time until cell voltage reaches $E_{EOD}$) at cycle index k, and $\phi_{1,k}$, $\phi_{2,k}$, $\phi_k$ and $\psi_k$ are independent zero-mean Gaussian noise terms. The first term on the right hand side in Eq. (9.2) reflects the Coulombic efficiency factor, while the second term models the capacity gain due to battery rest.

Again similar to the EOD case, equation 9 is used to propagate the particles representing the state vector (comprised of $C_k$ and $\beta_k$) through each iteration of the particle filter. Equation 10 is used to update the weights of the particles using the terminal voltage measurements. This simultaneously tunes the model parameters, β, along with estimating the state. At the point where prognosis is desired, the tuned model parameters are substituted into Equation 9, which is then computed in an iterative manner until the state value, in this case the battery capacity $C_k$, reaches a predetermined cut-off threshold.

Note that in both state equations (7) and (9), the model parameter is included as part of the state vector so that the PF can perform model identification in conjunction with state tracking.

Temperature dependence (T) of one or more of the parameters discussed in the preceding, including but not limited to state of charge SOC, charge capacity C, hours to drain nominal capacity r, Coulombic efficiency $\eta_C$, electrolyte resistance $R_E$, charge transfer resistance $R_{CT}$, dual layer capacitance $C_{DL}$, Warburg resistance $R_W$, theoretical open circuit voltage $E^0$, voltage drop due to self-discharge $\Delta E_{sd}$, voltage drop due to reactant depletion, $\Delta E_{rd}$, voltage drop due to mass transfer resistance $\Delta E_{mt}$, initial voltage drop during discharge $\Delta E_{init}$, one or more model parameters $\alpha_i$, one or more model parameters $\beta_i$, time $t_{EOD}$ at which voltage E reaches $E_{EOD}$, EOL capacity threshold $C_{EOL}$, and cycle index $k_{EOL}$ at which C reaches $C_{EOL}$, can be represented by an Arrhenius factor $$AF = A(T/T_0)^{\gamma_1}\exp\{-(\gamma_2/T)^{\gamma_3}\}, \quad (11)$$

where A is a physical parameter in appropriate units, $T_0$ is a reference temperature and ($\gamma_1$, $\gamma_2$, $\gamma_3$) are Arrhenius parameters associated with the particular electrochemical process variable being considered.

Some of these parameters, namely the initial voltage drop during discharge $\Delta E_{init}$ and the model parameters $\alpha_i$, are also dependent upon the load current I. This dependence is modeled by a linear proportionality factor $$LF = \theta I, \quad (12)$$

where θ is a proportionality constant whose value will be different for the different model parameters.

It is also important to note that the PF framework can not only be used for prognosis but for mission planning (decisioning) as well. If at the point of prediction the current prognosis, either in the EOD or the EOL case, does not meet the required usage or mission objectives, i.e., the battery does not have enough charge or cycle life, then a population of different future usage conditions (including but not limited to load current, temperature, charge and discharge duration) can be run through the prediction phase of the PF framework to come up with an alternate plan.

A PROCEDURE FOR PRACTICING THE INVENTION

Figure 10A:
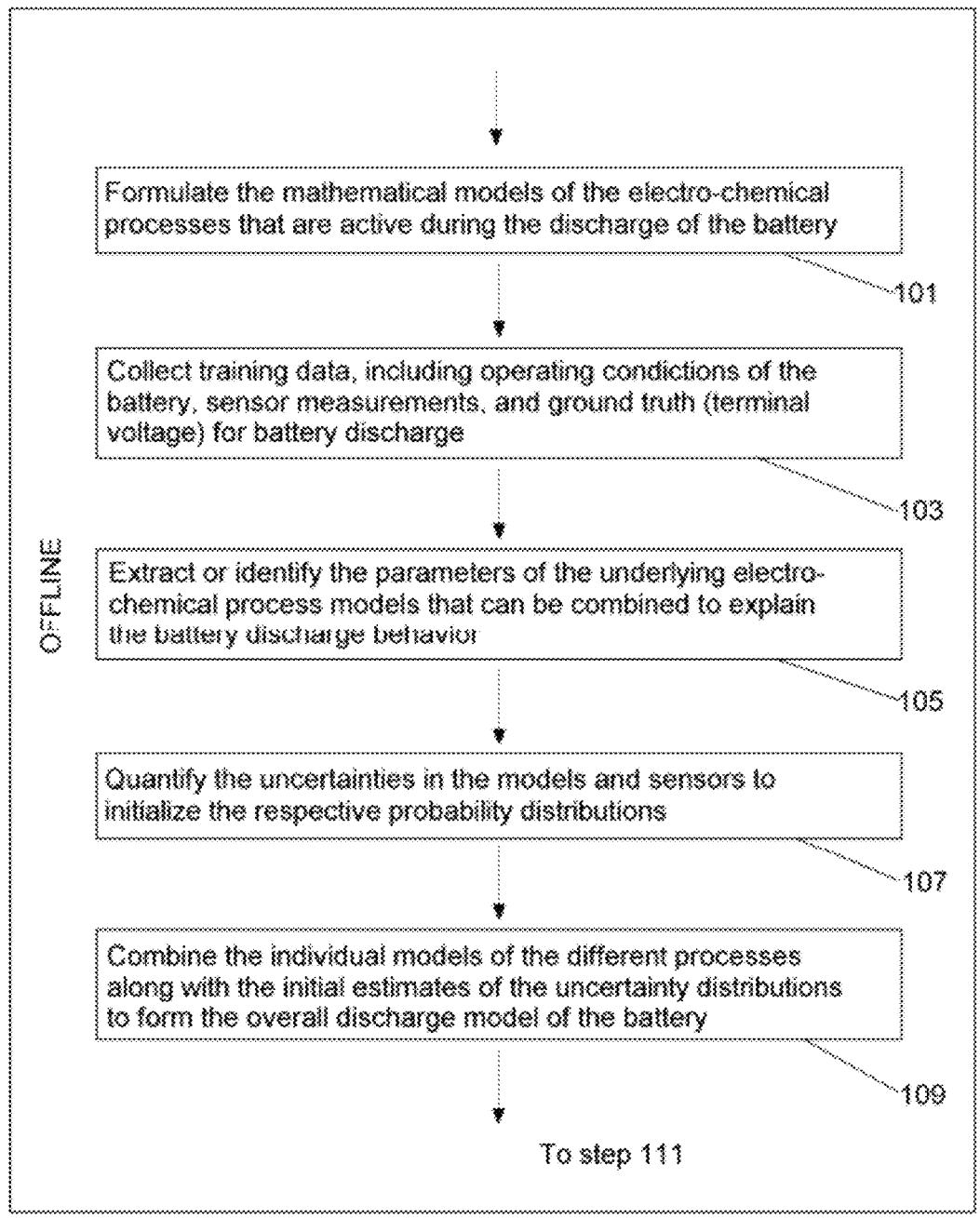
FIG. 10 is a flow chart illustrating the procedure for practicing the invention in regards to estimating SOC and predicting EOD.
Figure 10B:
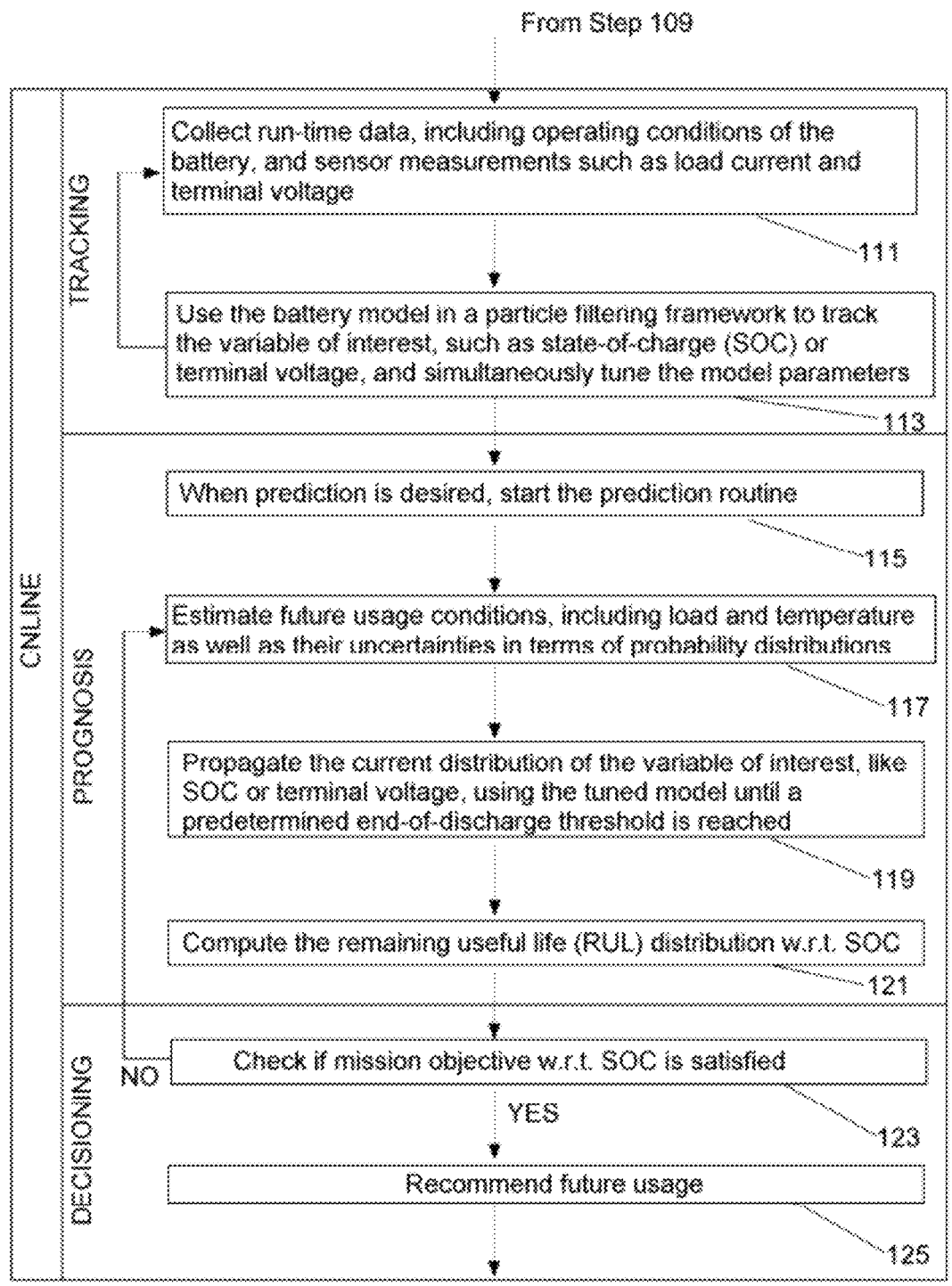

FIG. 10 is a flowchart illustrating a procedure for practicing the part of the invention that relates to estimating the SOC and predicting EOD. In step 101, a mathematical model of the electro-chemical processes that are active during the discharge of the battery, including Eqs. (1)-(5), (7) and (8), and optionally Eqs. (11) and (12), is formulated. In step 103, training data are collected for a representative battery, including operating conditions, sensor measurements like load current and temperature, and ground truth for battery discharge, which in our case in terminal voltage. In step 105, we extract or identify the parameters of the underlying electro-chemical process models, given by Eqs. (1)-(5), (7) and (8), and optionally Eqs. (11) and (12), that can be combined to explain the battery discharge behavior. We quantify the uncertainties in the models and sensors to initialize the respective probability distributions in step 107. Next, in step 109, we combine the individual models of the different processes along with the initial estimates of the uncertainty distributions to form the overall discharge model of the battery. The steps described till now are performed offline. The next steps are meant to be performed online, but may also be performed offline.

In step 111, we collect run-time data, including operating conditions of the battery, and sensor measurements like load current and terminal voltage. Then, in step 113, we use the battery model in a particle filtering framework, Eqs. (7) and (8), to track the variable of interest, like state-of-charge (SOC) or terminal voltage, and simultaneously tune the model parameters. Steps 111 and 113 comprise the tracking phase of the PF framework and needs to be repeated until the point where prediction is desired, depending upon some battery voltage threshold or some such user-determined criteria.

In step 115, we start the prediction routine while the tracking loop continues to run. In step 117, we estimate future usage conditions including load and temperature as well as their uncertainties in terms of probability distributions. Next, in step 119, we propagate the current distribution of the variable of interest, like SOC or terminal voltage, using the tuned model obtained in step 113, until a predetermined EOD threshold is reached. In step 121, we compute the remaining useful life (RUL) distribution w.r.t SOC by subtracting the time when prediction was started in step 115 from time when the EOD threshold is reached in step 119. Steps 115 to 119 comprise the prognosis part of the invention as applicable to the SOC of the battery.

The next steps indicate how the PF framework may be additionally used to decision making in the SOC context. If the RUL computed in step 121 does not meet usage requirements, i.e. remaining battery charge is too low, then, in step 123, we re-execute the prognosis process from step 117 with alternate future load profiles until the requirements are met. Subsequently, in step 125, we prescribe the viable alternate future usage that will satisfy user requirements.

In the case of a specific application domain like vehicles with electric propulsion based on batteries, several factors like acceleration, trajectory gradient or drag and ambient temperature can affect battery performance. In such cases, EOD prediction and decision making, steps 117-125, can be based on future use conditions that include navigation and route planning in conjunction with terrain and weather information.

Figure 11A:
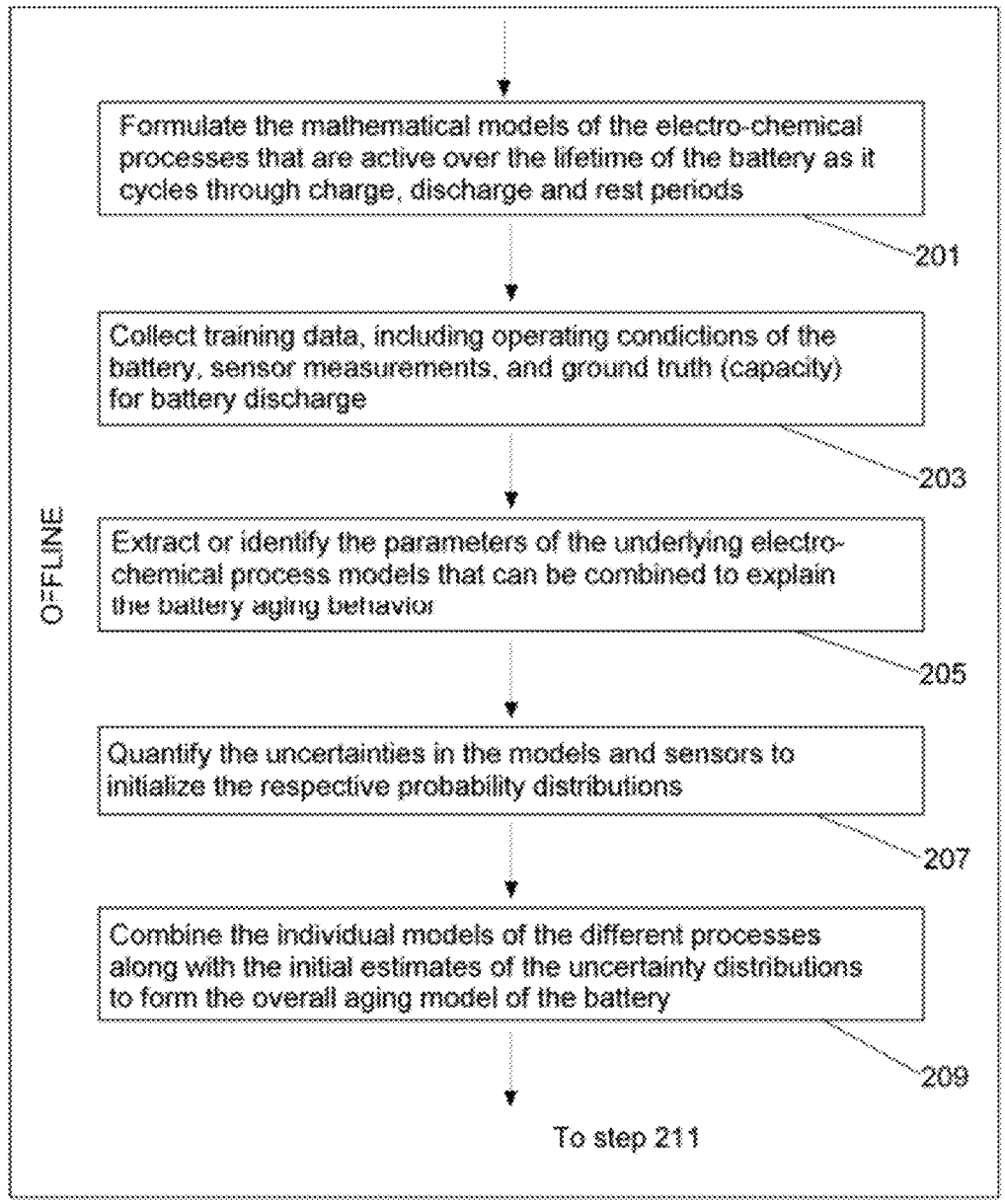
FIG. 11 is a flow chart illustrating the procedure for practicing the invention in regards to estimating SOL and predicting EOL.
Figure 11B:
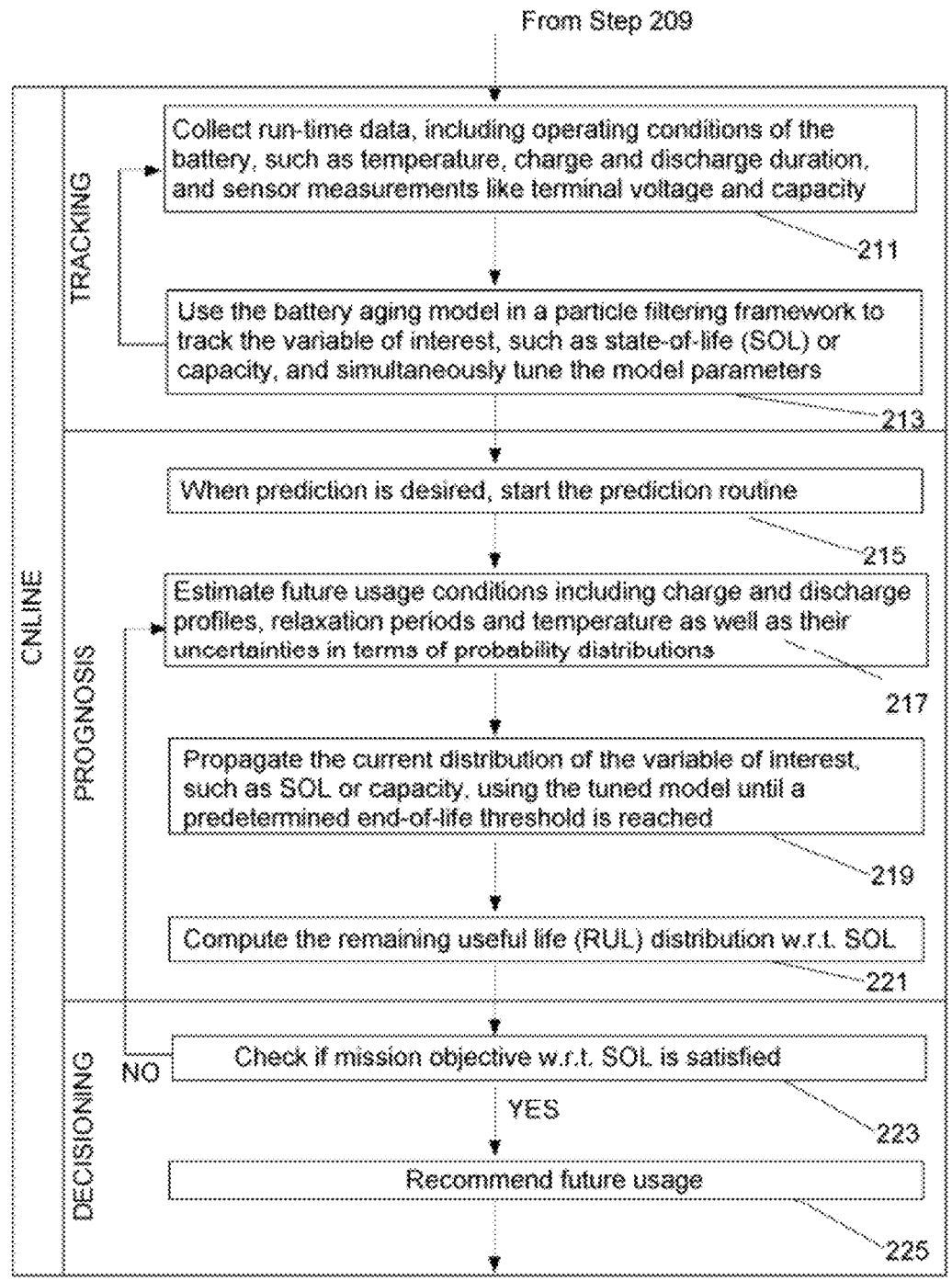

The flowchart in FIG. 11 that describes the procedure for estimating SOL and predicting EOL follows the same logic as the flowchart in FIG. 10 described above, with the steps number 2XY corresponding to the steps numbered 1XY in FIG. 10. There are some differences in this case which are discussed below.

The mathematical model considered tries to encapsulate the aging behavior of the battery as it cycles through charge, discharge and rest or relaxation periods. The relevant electro-chemical processes are represented by Eqs, (6), (9), (10) and optionally (11). The state variable of interest is SOL or battery capacity, C. The future usage conditions include charge and discharge profiles, relaxation periods and temperature as well as their uncertainties in terms of probability distributions. The user requirements will not be in terms of battery charge, but in terms of battery life or capacity. In the case of electric vehicles, the prognosis can be conditioned on factors like traffic patterns and diving profiles in addition to environmental factors like temperature.

Sample Results.

The data used to validate the above approach have been collected from a custom built battery prognostics testbed at the NASA Ames Prognostics Center of Excellence (PCoE). This testbed comprises:

Commercially available Li-ion 18650 sized rechargeable batteries,
Programmable 4-channel DC electronic load,
Programmable 4-channel DC power supply,
Voltmeter, ammeter and thermocouple sensor suite,
Custom EIS equipment,
Environmental chamber to impose various operational conditions,
PXI chassis based DAQ and experiment control, and
MATLAB based experiment control, data acquisition and prognostics algorithm evaluation setup.

In this testbed, Li-ion batteries were run through 3 different operational profiles (charge, discharge and EIS) at room temperature, 23° C. Charging was carried out in a constant current (CC) mode at 1.5 A until the battery voltage reached 4.2 V and then continued in a constant voltage (CV) mode until the charge current dropped to 20 mAmp. Discharge was carried out at a constant current (CC) level of 2 A until the battery voltage fell to 2.7 V. Repeated charge and discharge cycles result in accelerated aging of the batteries. The experiments were stopped when the batteries reached the EOL criteria of 30 percent fade in rated capacity (from 2 Amp-hour to 1.4 Amp-hour). Due to the differences in depth-of-discharge (DOD), the duration of rest periods and intrinsic variability, no two cells have the same SOL at the same cycle index. The aim is to be able to manage this uncertainty, which is representative of actual usage, and make reliable predictions of RUL in both the EOD and EOL contexts. Although several (>20) batteries were aged in this setup, we present the results from a single battery. The accuracy and precision of the predictions shown below is representative of the performance on the other batteries as well.

Figure 7:
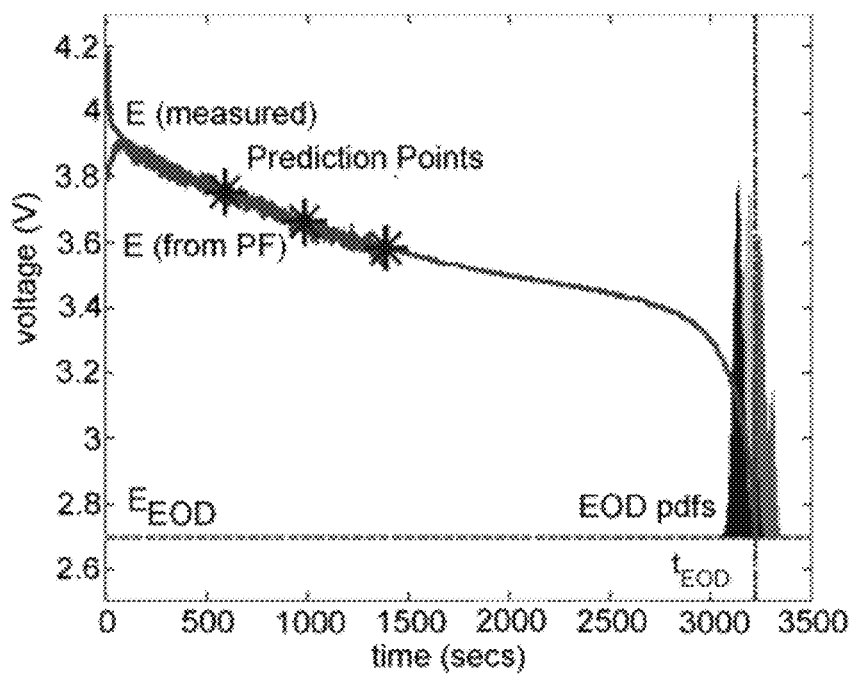
FIG. 7 graphically illustrates end-of-discharge (EOD) prediction according to the present invention.

FIG. 7 illustrates the EOD predictions generated by the PF algorithm for an arbitrarily selected discharge cycle of a Li-ion battery under test. The red solid line shows the measured cell voltage, while the green patch represents the envelope of the PF tracking performance. The battery model is tuned continuously until we reach one of the predetermined prediction points (denoted by blue asterisks), at which time we freeze the model and use it to extrapolate the particle distribution till the $E_{EOD}$) threshold.

It is to be noted that we do not generate a single-valued prediction or a mean value with confidence bounds, but a full EOD pdf. Predictions are made at multiple points to test the robustness of the algorithm to model parameter drift. The pdfs generated have high accuracy and precision as can be seen from the overlap of the blue shaded areas to the right of FIG. 7 and $t_{EOD}$ marked by the vertical red broken line. Because the pdfs overlap each other, they are differentiated by varying shades of a color (e.g., blue) with the earliest one being the lightest and the later ones being progressively darker. Also, to improve visibility, the pdfs have been scaled by a factor of 50 and shifted to the $E_{EOD}$) threshold.

Figure 8:
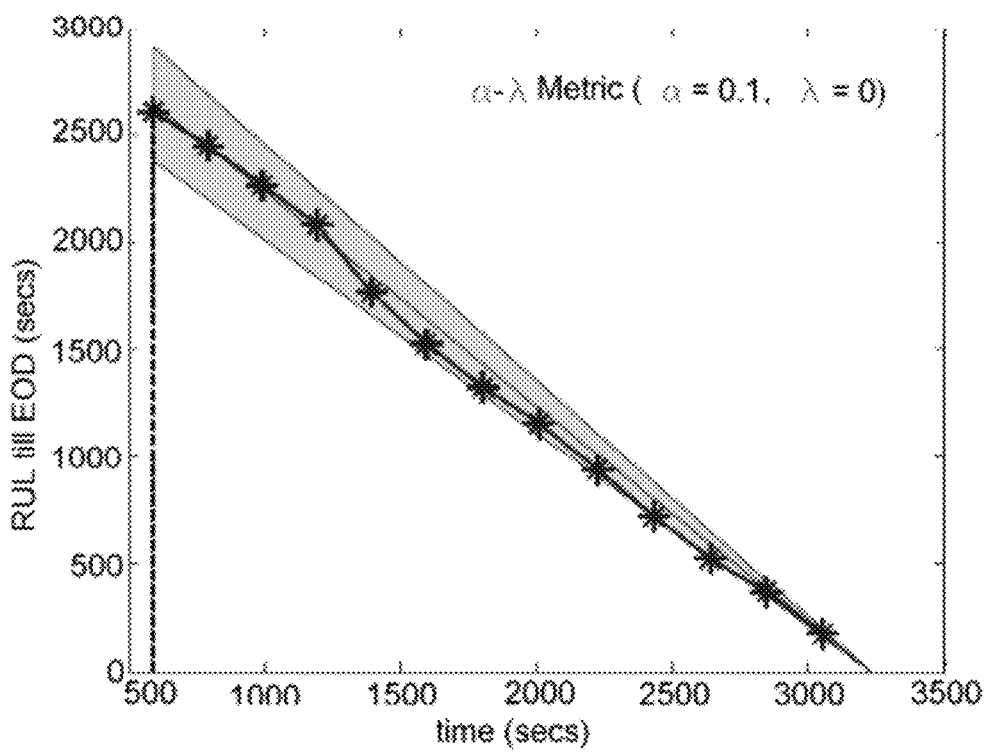
FIG. 8 graphically illustrates $\alpha$-$\lambda$, performance for EOD prediction.

In order to better quantify the prognostic performance, we calculate the α-λ, performance metric, as defined in (Saxena et al., 2008), for the prediction means computed as the weighted sum of the particle populations. We include several more prediction points in order to compute this metric, as shown by the asterisks in FIG. 8. It can be seen that we achieve 90 percent accuracy (α=0.1) right from the first prediction point onwards (λ=0). This means that 500 seconds into the discharge, which is about 55 minutes long, one can predict the EOD point to within ±4 minute confidence limits. Halfway into the discharge we can predict to within ±2 minutes 45 seconds, and so on.

Figure 9:
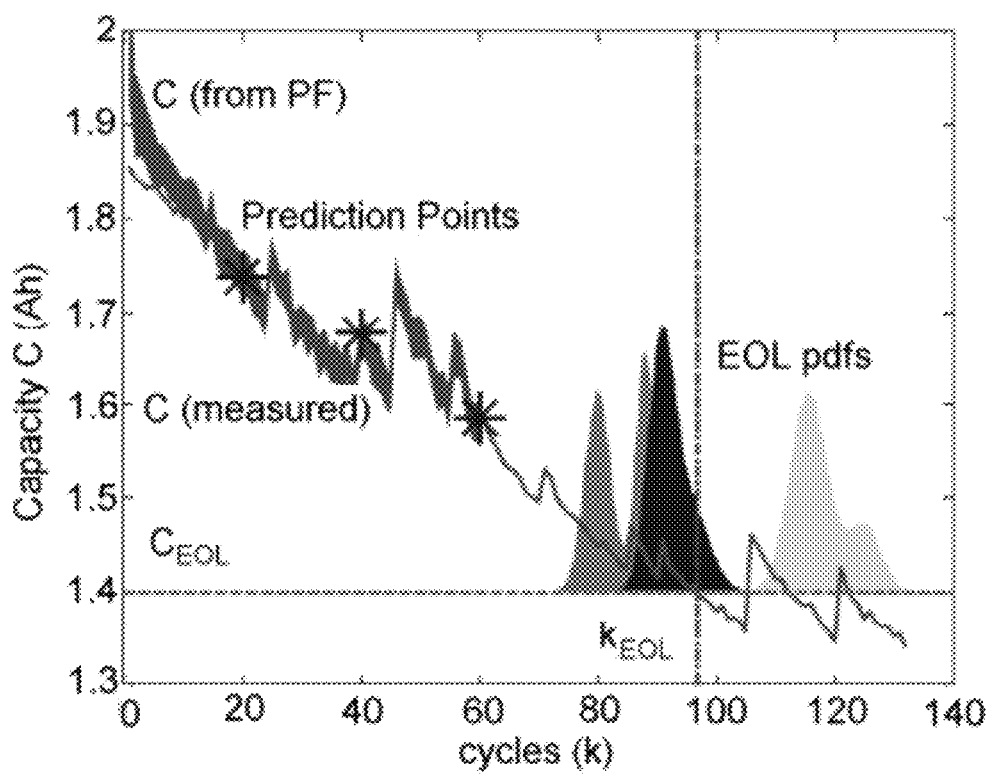
FIG. 9 graphically illustrates end-of-life (EOL) prediction for a Li-ion battery that is cycled many times.

The performance of the PF algorithm for EOL prediction problem is shown in FIG. 9. The measured capacity values are shown by the red solid line, the PF tracking by the green patch and the prediction points by the blue asterisks. The EOL pdfs are denoted by the blue patches, lighter shades indicating earlier predictions. Note that modeling the capacity gain due to rest, as shown in Eq. (9), allows the PF to maintain track of the capacity during rests and make predictions accordingly. When predicting, the planned future usage and rest conditions are made available to the PF framework. As can be seen, the EOL pdfs do overlap the cycles where the measured capacity crosses the EOL threshold of 1.4 Amp-hour. Further enhancements of this approach will be tackled in future research; however, the feasibility of this PF based prognostics methodology has been demonstrated.

CONCLUSION

In summary, this disclosure sets forth an empirical model to describe battery behavior during individual discharge cycles as well as over its cycle life. The basis for the form of the model has been linked to the internal processes of the battery and validated using experimental data.

Subsequently, the model has been used in a PF framework to make predictions of EOD and EOL effectively. Although the model has been developed with Li-ion battery chemistries in mind, it can be applied to other batteries as long as effects specific to those chemistries are modeled as well (e.g. the memory effect in Ni—Cd rechargeable batteries).

The prediction results have been satisfactory so far, however, there remains considerable room for improvement. The model fidelity will improve when the influence of factors like temperature, discharge C-rate, DOD, SOC after charging, etc., are explicitly incorporated. This requires further intensive theoretical as well as experimental investigation of battery behavior. As the understanding of these factors improves, we will be able to better take advantage of advanced filtering techniques like unscented PF, Rao-Blackwellized PF (Saha et al., 2009), and others, to further refine prognostic performance.

Nomenclature

| | |
|---|---|
| DOD | depth-of-discharge |
| EOD | end-of-discharge |
| EOL | end-of-life |
| RUL | remaining useful life |
| SOC | state-of-charge |
| SOL | state-of-life |
| C | charge capacity |
| I | load current |
| r | hours required to drain nominal capacity |
| $\eta_C$ | Coulombic efficiency |
| $R_E$ | electrolyte resistance |
| $R_{CT}$ | charge transfer resistance |
| $C_{DL}$ | dual-layer capacitance |
| $R_W$ | Warburg resistance |
| t | time variable |
| i | time index |
| k | cycle index |
| E | cell voltage |
| E° | theoretical open circuit voltage |
| $E_{EOD}$ | |
| $\Delta E_{sd}$ | voltage drop due to self-discharge |
| $\Delta E_{rd}$ | voltage drop due to reactant depletion |
| $\Delta E_{mt}$ | voltage drop due to mass transfer resistance |
| $\Delta E_{init}$ | initial voltage drop during discharge |
| A | Arrhenius physical parameter (dependent upon process) |
| T | battery temperature |
| $T_0$ | reference temperature (dependent upon process) |
| $\alpha_{j-1,\ldots,5}$ | EOD model parameters for charge depletion |
| $\beta_{j-1,2}$ | EOL model parameters for discharge cycles |
| $\gamma_{j-1,\ldots,3}$ | Arrhenius model parameters |
| θ | proportionality constant with respect to current I |
| $\Delta t_k$ | length of rest period between cycles k and k + 1 |
| ω, ν, φ, ψ | zero-mean Gaussian noise terms |
| $E_{EOD}$ | EOD voltage threshold (e.g., 2.7 Volt) |
| $t_{EOD}$ | time at which E reaches $E_{EOD}$ |
| $C_{EOL}$ | EOL capacity threshold (e.g., 1.4 Amp-hour) |
| $k_{EOL}$ | cycle when C reaches $C_{EOL}$ |

REFERENCES (Bhangu et al., 2005) B. S. Bhangu, P. Bentley, D. A. Stone, and C. M. Bingham. Nonlinear Observers for Predicting State-of-Charge and State-of-Health of Lead-Acid Batteries for Hybrid-Electric Vehicles, IEEE Transactions on Vehicular Technology, vol. 54, no. 3, pp. 783-794, 2005.

(Blanke et al., 2005) H. Blanke, O. Bohlen, S. Buller, R. W. De Doncker, B. Fricke, A. Hammouche, D. Linzen, M. Thele, and D. U. Sauer. Impedance Measurements on Lead-acid Batteries for State-of-Charge, State-of-Health and Cranking Capability Prognosis in Electric and Hybrid Electric Vehicles, Journal of Power Sources, vol. 144, no. 2, pp. 418-425, 2005.

(Buchmann, 2001) I. Buchmann. Will Lithium-Ion batteries power the new millennium?, http://www.buchmann.ca/Article5-Page1.asp.

(CA ISO, 2008) California ISO. 2008 Summer Loads and Resources Operations Preparedness Assessment, http://www.caiso.com/1fb7/1fb7855eed50.pdf.

(Cox and Perez-Kite, 2000) D.C. Cox and R. Perez-Kite. Battery State of Health Monitoring, Combining Conductance Technology with other Measurement Parameters for Real-time Battery Performance Analysis, in Proceedings of 22nd International Telecommunications Energy Conference, INTELEC, pp. 342-347, 2000.

(Fein, 2003) G. S. Fein. Battery Supplies Ran Dangerously Low in Iraq, National Defense Magazine, September 2003.

(Gao et al., 2002) L. Gao, S. Liu, and R. A. Dougal. Dynamic Lithium-Ion Battery Model for System Simulation, IEEE Transactions on Components and Packaging Technologies, vol. 25, no. 3, pp. 495-505, 2002.

(Goebel et al., 2008) K. Goebel, B. Saha, A. Saxena, J. R. Celaya, and J. Christophersen. Prognostics in Battery Health Management, IEEE Instrumentation and Measurements Magazine, vol. 11, no. 4, pp. 33-40, 2008.

(Gordon et al., 1993) N. J. Gordon, D. J. Salmond, and A. F. M. Smith (1993, April). Novel Approach to Nonlinear/Non-Gaussian Bayesian State Estimation, Radar and Signal Processing, IEE Proceedings F, vol. 140, no. 2, pp. 107-113, 1993.

(Hartley and Jannette, 2005) T. Hartley and A. G. Jannette. A First Principles Model for Nickel-Hydrogen Batteries, in Proceedings of American Institute of Aeronautics and Astronautics' 3rd International Energy Conversion Engineering Conference, San Francisco, Calif., August 2005.

(Hartmann II, 2008) R. L. Hartmann II. An Aging Model for Lithium-Ion Cells, PhD dissertation, University of Akron, 2008.

(HowStuffWorks, 2000) HowStuffWorks. Why do batteries seem to go dead and then come back to life if you let them rest?, http://electronics.howstuff works.com/question390.htm.

(Huggins, 2008) R. Huggins. Advanced Batteries: Materials Science Aspects, $1^{st}$ ed., Springer, 2008.

(Jaworski, 1999) R. K. Jaworski. Statistical Parameters Model for Predicting Time to Failure of Telecommunications Batteries, in Proceedings of 21st International Telecommunications Energy Conference, INTELEC, 1999.

(Kozlowski, 2003) J. D. Kozlowski. Electrochemical Cell Prognostics Using Online Impedance Measurements and Model-based Data Fusion Techniques, in Proceedings of IEEE Aerospace Conference 2003, vol. 7 pp. 3257-3270, 2003.

(Meissner and Richter, 2003) E. Meissner and G. Richter. Battery Monitoring and Electrical Energy Management—Precondition for Future Vehicle Electric Power Systems, Journal of Power Sources, vol. 116, no. 1, pp. 79-98, 2003.

(PKIDs, 2009) PKIDs. PKIDs goes Green, PKIDs Online, http://www.pkids.org/ap_green.php.

(Plett, 2004) G. L. Plett. Extended Kalman Filtering for Battery Management Systems of LiPB-based HEV Battery Packs, Parts 1-3, Journal of Power Sources, vol. 134, issue 2, pp. 252-292, 2004.

(Rufus et al., 2008) F. Rufus, S. Lee, and A. Thakker. Health Monitoring Algorithms for Space Application Batteries, in Proceedings of International Conference on Prognostics and Health Management, 2008, PHM 2008, Denver, Colo., October 2008.

(Saha and Goebel, 2009) B. Saha and K. Goebel. Modeling Li-ion Battery Capacity Depletion in a Particle Filtering Framework, Annual Conference of the Prognostics and Health management Society, 2009.

(Saha et al., 2009) B. Saha, K. Goebel, S. Poll, and J. Christophersen. Prognostics Methods for Battery Health Monitoring Using a Bayesian Framework, IEEE Transactions on Instrumentation and Measurement, vol. 58, no. 2, pp. 291-296, 2009.

(Santhanagopalan et al., 2008) S. Santhanagopalan, Q. Zhang, K. Kumaresan, and R. E. White. Parameter Estimation and Life Modeling of Lithium-Ion Cells, Journal of The Electrochemical Society, vol. 155, no. 4, pp. A345-A353, 2008.

(Saxena et al., 2008) A. Saxena, J. Celaya, E. Balaban, K. Goebel, B. Saha, S Saha, and M. Schwabacher. Metrics for Evaluating Performance of Prognostic Techniques, in Proceedings of Intl. Conf. on Prognostics and Health Management, Denver, Colo., October 2008.

(Stamps et al., 2005) A. T. Stamps, C. E. Holland, R. E. White, and E. P. Gatzke. "Analysis of Capacity Fade in a Lithium Ion Battery." Journal of Power Sources, vol. 150, pp. 229-239, 2005.

(Vutetakis and Viswanathan, 1995) D. G. Vutetakis and V. V. Viswanathan. Determining the State-of-Health of Maintenance-Free Aircraft Batteries, in Proceedings of Tenth Annual Battery Conference on Applications and Advances, Proceedings, pp. 13-18, 1995.

What is claimed is:

1. A method for estimating remaining useful life (RUL) of a battery during discharge of the battery, the method comprising providing a computer system that is programmed:

to provide or receive a quantitative empirical model with at least one associated model parameter for at least one electro-chemical process that is active during discharge of the battery;

to receive and use measured values provided by one or more sensors for at least one electro-chemical process that is active during discharge of the battery;

to receive and use training data comprising at least one of: at least one operating, condition for the battery, at least one sensor measurement value for battery operation, and at least one ground truth attribute for battery discharge;

to compute and incorporate at least one numerical parameter value for the electro-chemical process that characterizes battery discharge behavior;

to identify at least one uncertainty in the quantitative model, including an uncertainty range for the at least one model parameter and an uncertainty range for the at least one measured sensor value;

to provide and incorporate at least one numerical value for at least one probability density function (pdf) corresponding to a distribution of the at least one uncertainty;

to provide at least one process model of at least one process component with at least one estimate of an value of a probability density function (pdf) for a distribution of at least one uncertainty in the at least one process model, to provide a characterization of battery discharge;

to provide or receive run-time data, including the at least one battery operating condition and at least one sensor measurement value; and to apply the quantitative model of the battery in a particle filtering framework to estimate at least one battery discharge variable of interest, comprising at least one of state of charge (SOC) and terminal voltage of the battery, and to contemporaneously modify the at least one model parameter value used in the quantitative model.

2. The method of claim 1, wherein said computer is further programmed to choose said battery operating condition from a group of conditions comprising battery terminal voltage, battery load current, and battery temperature.

3. The method of claim 1, wherein said computer is further programmed to incorporate ambient temperature in said at least one operating condition.

4. The method of claim 1, further comprising decomposing said battery discharge behavior into a plurality of sub-processes of said battery, with at least one sub-process comprising at least one of mass-transfer, battery self-discharge, and reactant depletion, with corresponding model parameters and uncertainty distributions.

5. The method of claim 1, wherein said computer is further programmed so that, when a user of said computer program indicates that prediction of said battery discharge behavior is desired, said computer is further programmed:

to provide or receive at least one anticipated future use condition of said battery;

to provide or receive at least one said pdf that is associated with said at least one uncertainty distribution in said at least one sensor measurement value associated with operation of said battery;

to propagate said at least one battery discharge variable of interest to a selected time later than present time or to at least one predetermined threshold value for said battery discharge variable of interest being propagated; and to estimate said RUL of said battery during discharge, said RUL comprising time remaining until said battery reaches an end-of-discharge (EOD) state.

6. The method of claim 5, further comprising decomposing said battery discharge behavior into a plurality of sub-processes of said battery, with at least one sub-process comprising at least one of mass-transfer, self-discharge; and reactant depletion, with corresponding model parameters and uncertainty distributions.

7. The method of claim 6, applied to a vehicle having partial or complete electric propulsion, where said future use conditions comprise at least one of desired destination, terrain information for a desired route, trajectory gradient information for the desired route, traffic information for the desired route, weather data, and expected temperature profile along the desired route.

8. The method of claim 7, further comprising using information on said EOD with at least one of said destination information, said terrain information, and said traffic information to provide at least one driving recommendation that may extend a time at which said EOD will occur, determined by performing a trade-off analysis of at least two load scenarios for said battery.

9. A method for estimating remaining useful life (RUL) of a battery over battery cycle life as the battery experiences a plurality of charge, discharge, and rest periods, the method comprising providing a computer system that is programmed:

to provide or receive a quantitative empirical model with at least one associated parameter to be determined from sensor measurements, wherein the basis for the form of the model is linked to at least one internal electro-chemical process of the battery that is active during at least one of charge, discharge and rest period of the battery;

to receive and use at least one of said measured values provided by one or more sensors for the at least one electro-chemical process that is active during the at least one of the charge, discharge and rest periods of the battery, to infer or estimate at least one numerical parameter value for the model;

to receive training data, comprising at least one of: at least one operating condition for the battery, battery storage condition, at least one measured sensor value for battery operation, and at least one ground truth attribute for battery capacity;

to identify at least one uncertainty in the quantitative model, including an uncertainty range for at least one model parameter and an uncertainty range for at least one measured sensor value, and to initialize at least one probability density function (pdf) for a distribution of the at least one uncertainty;

to provide at least one process model of at least one process component with at least one estimate of the at least one uncertainty pdf to provide a characterization of battery ageing behavior;

to provide or receive run-time data, including the at least one battery operating condition, battery storage condition, and the at least one sensor measurement value for battery operation; and to apply the quantitative model of the battery in a particle filtering framework to track or monitor at least one battery cycle life variable of interest, comprising at least one of state of life (SOL) and capacity of the battery, and to contemporaneously modify at least one model parameter value used in the quantitative model.

10. The method of claim 9, wherein said computer is further programmed to choose said at least one battery operating condition from at least one condition, comprising battery depth of discharge (DOD), battery charge current, and battery storage state of charge SOC.

11. The method of claim 10, wherein said battery storage includes at least first and second battery rest periods having different rest period lengths.

12. The method of claim 9, wherein said computer is further programmed to incorporate ambient temperature in said at least one operating condition.

13. The method of claim 9, wherein said battery ageing behavior is decomposed into a plurality of sub-processes of said battery, wherein at least one sub-process comprises at least one of capacity loss due to Coulombic efficiency factor and capacity recovery during rest, with corresponding model parameters and uncertainty distributions.

14. The method of claim 9, wherein said at least one battery cycle life variable of interest is based on a lumped parameter model, in which at least one component, comprising electrolyte resistance, Warburg resistance, charge transfer resistance, and dual-layer capacitance, is determined by electrochemical impedance spectroscopy (EIS) measurements.

15. The method of claim 9, wherein said computer is further programmed so that, when a user of said computer program indicates that prediction of battery life is desired, said computer is further programmed:

to provide or receive at least one anticipated future use condition of said battery, comprising at least one battery charge profile, at least one battery discharge profile, and at least one battery storage condition;

to provide or receive said at least one pdf that is associated with a distribution of said at least one uncertainty in said at least one sensor value associated with use of said battery;

to propagate said at least one battery cycle life variable of interest to a selected time later than present time or to at least one predetermined threshold value for said at least one battery cycle life variable of interest being propagated; and to estimate said RUL of said battery, said RUL comprising a time remaining until said battery reaches an end-of-life (EOL) state.

16. The method of claim 15, further comprising decomposing battery ageing behavior into a plurality of sub-processes of said battery, with at least one of the sub-processes comprising at least one of capacity loss due to Coulombic efficiency factor, and capacity recovery during rest, with corresponding model parameters and uncertainty distributions.

17. The method of claim 15, wherein said at least one battery cycle life variable of interest is based on a lumped parameter model, in which at least one component, comprising electrolyte resistance, Warburg resistance, charge transfer resistance, and dual-layer capacitance, is determined by at least one EIS measurement.

18. The method of claim 15, applied to a vehicle with partial or complete electric propulsion, where said future use conditions comprise at least one of vehicle driving profiles, vehicle storage conditions and vehicle maintenance schedules.

19. The method of claim 18, wherein information on climate and terrain and said EO state are received or provided to formulate at least one of storage recommendation and maintenance recommendation that may extend a time at which said EOL state will occur, by performing a trade-off analysis of at least two use scenarios for said battery.

20. A system for estimating remaining useful life (RUL) of a battery during discharge of the battery, embodying a program on instructions executable by a computer, wherein the computer system is programmed:
   to provide or receive a quantitative empirical model with at least one associated model parameter for at least one electro-chemical process that is active during discharge of the battery;
   to receive and use measured values provided by one or more sensors for at least one electro-chemical process that is active during discharge of the battery;
   to receive and use training data comprising at least one of: at least one operating condition for the battery, at least one sensor measurement value for battery operation, and at least one ground truth attribute for battery discharge;
   to compute and incorporate at least one numerical parameter value for the electro-chemical process that characterizes battery discharge behavior;
   to identify at least one uncertainty in the quantitative model, including an uncertainty range for at least one model parameter and an uncertainty range for at least one measured sensor value;
   to provide and incorporate at least one numerical value for at least one probability density function (pdf) corresponding to a distribution of the at least one uncertainty;
   to provide at least one process model of at least one process component with at least one estimate of a value of a probability density function (pdf) for a distribution of at least one uncertainty in the at least one process model, to provide a characterization of battery discharge;
   to provide or receive run-time data, including the at least one battery operating condition and the at least one sensor measurement value; and
   to apply the quantitative model of the battery in a particle filtering framework to provide an estimate of at least one battery discharge variable of interest, comprising state of charge (SOC) and terminal voltage of the battery, and to contemporaneously modify at least one model parameter value used in the quantitative model.

21. The system of claim 20, wherein said computer system is further programmed to choose said battery operating condition from a group of conditions comprising battery terminal voltage, battery load current, and battery temperature.

22. The system of claim 20, wherein said computer system is further programmed to incorporate ambient temperature in at least one of said operating conditions.

23. The system of claim 20, wherein said computer system is further programmed to decompose said battery discharge behavior into a plurality of sub-processes of said battery, with at least one sub-process comprising at least one of mass-transfer, battery self-discharge, and reactant depletion, with corresponding model parameters and uncertainty distributions.

24. The system of claim 20, wherein when a user of said computer system indicates that prediction of said battery discharge behavior is desired, said computer system is further programmed:
   to provide or receive at least one anticipated future use condition of said battery;
   to provide or receive at least one said pdf that is associated with said at least one uncertainty distribution in said at least one sensor measurement value associated with operation of said battery;
   to propagate said at least one battery discharge variable of interest to a selected time later than present time or to at least one predetermined threshold value for said battery discharge variable of interest being propagated; and
   to estimate said RUL of said battery during discharge, said RUL comprising time remaining until said battery reaches an end-of-discharge (EOD) state.

25. The system of claim 24, wherein said computer system is further programmed to decompose said battery discharge behavior into a plurality of sub-processes of said battery, with at least one sub-process comprising at least one of mass-transfer, self-discharge, and reactant depletion, with corresponding model parameters and uncertainty distributions.

26. The system of claim 25, wherein said computer system is applied to a vehicle having partial or complete electric propulsion, where said future use conditions comprise at least one of desired destination, terrain information for a desired route, trajectory gradient information for the desired route, traffic information for the desired route, weather data, and expected temperature profile along the desired route.

27. The system of claim 26, wherein said computer system is further programmed to use information on said EOD with at least one of said destination information, said terrain information, and said traffic information to provide at least one driving recommendation that may extend a time at which said EOD will occur, determined by performing a trade-off analysis of at least two load scenarios for said battery.

28. A system for estimating remaining useful life (RUL) of a battery over battery cycle life as the battery experiences a plurality of charge, discharge, and rest periods, embodying a program on instructions executable by a computer, wherein the computer system is programmed:
   to provide or receive a quantitative empirical model with at least one associated parameter to be determined from sensor measurements, wherein the basis for the form of the model is linked to at least one internal electro-chemical process of the battery that is active during at least one of charge, discharge and rest period of the battery;
   to receive and use at least one measured value provided by one or more sensors for the at least one electro-chemical process that is active during the at least one of the charge, discharge and rest periods of the battery, to infer or estimate at least one numerical parameter value for the model;
   to receive training data, comprising at least one of: at least one operating condition for the battery, battery storage condition, at least one measured sensor value for battery operation, and at least one ground truth attribute for battery capacity;
   to identify at least one uncertainty in the quantitative model, including an uncertainty range for at least one model parameter and an uncertainty range for at least one measured sensor value, and to initialize at least one probability density function (pdf) for a distribution of the at least one uncertainty;
   to provide at least one process model of at least one process component with at least one estimate of the at least one uncertainty pdf to provide a characterization of battery ageing behavior;

to provide or receive run-time data, including at least one of battery operating condition, battery storage condition, and the at least one sensor measurement value for battery operation; and to apply the quantitative model of the battery in a particle filtering framework to provide an estimate of at least one battery cycle life variable of interest, comprising state of life (SOL) and capacity of the battery, and to contemporaneously modify at least one model parameter value used in the quantitative model.

29. The system of claim 28, wherein said computer system is further programmed to choose said battery operating condition from at least one condition, comprising battery depth of discharge (DOD), battery charge current, and battery storage state of charge SOC.

30. The system of claim 29, wherein said battery storage includes at least first and second battery rest periods having different rest period lengths.

31. The system of claim 28, wherein said computer system is further programmed to incorporate ambient temperature in said at least one operating condition.

32. The system of claim 28, wherein said computer system is further programmed to decompose said battery ageing behavior into a plurality of sub-processes of said battery, wherein at least one sub-process comprises at least one of capacity loss due to Coulombic efficiency factor and capacity recovery during rest, with corresponding model parameters and uncertainty distributions.

33. The system of claim 28, wherein said computer system is further programmed so that said at least one battery cycle life variable of interest is based on a lumped parameter model, in which at least one component, comprising electrolyte resistance, Warburg resistance, charge transfer resistance, and dual-layer capacitance, is determined by electrochemical impedance spectroscopy (EIS) measurements.

34. The system of claim 28, wherein when a user of said computer system indicates that prediction of battery life is desired, said computer system is further programmed:

to provide or receive at least one anticipated future use condition of said battery, drawn from a group of conditions comprising at least one battery charge profile, at least one battery discharge profile, and at least one battery storage condition;

to provide or receive said at least one pdf that is associated with a distribution of said at least one uncertainty in said at least one sensor value associated with use of said battery;

to propagate said at least one variable of interest to a selected time later than present time or to at least one predetermined threshold value for said at least one battery cycle life variable of interest being propagated; and to estimate said RUL of said battery, said RUL comprising a time remaining until said battery reaches an end-of-life (EOL) state.

35. The system of claim 34, wherein said computer system is further programmed to decompose said battery ageing behavior into a plurality of sub-processes of said battery, with at least one of the sub-processes comprising at least one of capacity loss due to Coulombic efficiency factor, and capacity recovery during rest, with corresponding model parameters and uncertainty distributions.

36. The system of claim 34, wherein said computer system is further programmed so that said at least one battery cycle life variable of interest is based on a lumped parameter model, in which at least one component, comprising electrolyte resistance, Warburg resistance, charge transfer resistance, and dual-layer capacitance, is determined by at least one EIS measurement.

37. The system of claim 34, wherein said computer system is applied to a vehicle with partial or complete electric propulsion, where said future use conditions comprise at least one of vehicle driving profiles, vehicle storage conditions and vehicle maintenance schedules.

38. The system of claim 37, wherein said computer system is further programmed so that information on climate and terrain and said EOL state are received or provided to formulate at least one of storage recommendation and maintenance recommendation that may extend a time at which said EOL state will occur by performing a trade-off analysis of at least two use scenarios for said battery.

* * * * *